US008438207B2

(12) United States Patent
Bolotski et al.

(10) Patent No.: US 8,438,207 B2
(45) Date of Patent: May 7, 2013

(54) ADAPTIVE PRECISION ARITHMETIC UNIT FOR ERROR TOLERANT APPLICATIONS

(75) Inventors: Josephine Ammer Bolotski, Seattle, WA (US); Jenny Bui, Seattle, WA (US); Qi Lu, Seattle, WA (US)

(73) Assignee: University of Washington, Seattle, WA (US)

( * ) Notice: Subject to any disclaimer, the term of this patent is extended or adjusted under 35 U.S.C. 154(b) by 1213 days.

(21) Appl. No.: 11/864,580

(22) Filed: Sep. 28, 2007

(65) Prior Publication Data

US 2009/0089348 A1 Apr. 2, 2009

(51) Int. Cl.
*G06F 7/52* (2006.01)

(52) U.S. Cl.
USPC .......................................................... 708/625

(58) Field of Classification Search .................. None
See application file for complete search history.

(56) References Cited

U.S. PATENT DOCUMENTS

| | | | | | |
|---|---|---|---|---|---|
| 3,665,171 | A | * | 5/1972 | Morrow | 708/319 |
| 4,338,676 | A | * | 7/1982 | Briley | 708/707 |
| 4,970,676 | A | * | 11/1990 | Fling | 708/627 |
| 5,150,321 | A | * | 9/1992 | Keating | 708/627 |
| 5,442,579 | A | * | 8/1995 | Thomson | 708/628 |
| 5,446,909 | A | * | 8/1995 | Intrater et al. | 712/42 |
| 6,301,596 | B1 | * | 10/2001 | Karanovic | 708/319 |
| 7,069,290 | B2 | * | 6/2006 | Garrett et al. | 708/625 |

OTHER PUBLICATIONS

Breuer, M.A., et al., "Defect and Error Tolerance in the Presence of Massive Numbers of Defects," *IEEE Design & Test of Computers* 21:216-227, May-Jun. 2004.

Calhoun, B.H., et al., Modeling and Sizing for Minimum Energy Operation in Subthreshold Circuits, *IEEE Journal of Solid-State Circuits* 40(9), Sep. 2005.

Chen, T.C., "Where CMOS is Going: Trendy Hype vs. Real Technology," ISSCC 2006 IEEE International Conference Digest of Technical Papers, pp. 1-18, Feb. 2006.

Datta, R., et al., "Adaptive Design for Performance-Optimized Robustness," IEEE International Symposium on Defect and Fault Tolerance in VLSI Systems, 9 pp., Oct. 2006.

Guo, L. et al., "An Energy Scalable Computational Array for Sensor Signal Processing," ISSCC 2006, IEEE Custom Integrated Circuits, pp. 317-320, Sep. 2006.

Hegde, R. and N.R. Shanbhag, "Soft Digital Signal Processing," *IEEE Trans. VLSI* 9:813-823, Dec. 2001.

Nicol, C.J. and P. Larsson, "Low Power Multiplication for FIR Filters," International Symposium on Low Power Electronics and Design, pp. 76-79, 1997.

Shim, B., et al., "Reliable Low-Power Digital Signal Processing via Reduced Precision Redundancy," *IEEE Trans. VLSI* 12:497-510, May 2004.

* cited by examiner

*Primary Examiner* — David H Malzahn
(74) *Attorney, Agent, or Firm* — Blakely Sokoloff Taylor & Zafman LLP (57) ABSTRACT

Two process-tolerant arithmetic circuit architectures are implemented to develop functional blocks for error-tolerant applications such as FIR filters and FFT blocks. The resulting blocks may achieve computational performance of up to 42 times higher than conventional architectures. Embodiments adaptively change the precision of the computation to achieve a high precision computation given the underlying speed of the circuit. The resulting improvement can be allocated to increasing yield or dynamically trading off between reduced power consumption, faster computation, or higher-fidelity computation.

14 Claims, 11 Drawing Sheets

ADAPTIVE PRECISION ARITHMETIC UNIT FOR ERROR TOLERANT APPLICATIONS

BACKGROUND

1. Field

Embodiments of the present invention relate to signal processing and, in particular, to digital signal processing.

2. Discussion of Related Art

As semiconductor technology is scaled, process variation becomes an ever-increasing problem. Even in the 90 nm node, threshold variance alone has become a significant factor. Designs meeting the worst-case process corner incur a 100% increase in energy per computation or a 25% performance penalty at the same energy consumption versus designs meeting the typical case. T. C. Chen, "Where CMOS is going: trendy hype vs. real technology," ISSCC, 2006 IEEE Int. Conference Digest of Technical Papers, pp. 1-18, February 2006 discusses this. With larger process variations, design for the worst-case incurs an unacceptably high penalty. Relaxing the requirement for 100% correctness can significantly reduce these penalties.

Process variation may be defined rather broadly as any effect that may cause the transistor speed to vary. These include manufacturing effects, voltage and temperature fluctuations, and device degradation over the product lifetime. Of these, only manufacturing process effects are constant for a given chip, while the others are time-varying. In addition, voltage fluctuations are defined rather broadly to include voltage supply noise as well as intentional voltage scaling and voltage over scaling to save power consumption. The notion of voltage over scaling, intentionally scaling the voltage lower than that required for correct operation, was described in R. Hegde and N. R. Shanbhag, "Soft digital signal processing," IEEE Trans. VLSI, vol. 9, pp. 813-823, December 2001.

Many applications (wireless communication, audio and video sigal processing, graphics, data mining, etc.) can tolerate some degree of error. The challenges and opportunities for error-tolerant design were laid out in M. A. Breuer, S. K. Gupta and T. M. Mak, "Defect and error tolerance in the presence of massive numbers of defects," IEEE Design & Test of Computers, vol. 21 pp, 216-227, May-June 2004. The key challenge is ensuring that any errors due to process variation cause small changes in the final system output. For instance wireless communication devices are inherently designed with robustness to noise. As long as the aggregate system noise does not exceed some noise margin, the system will meet the quality of service goals. Noise margin is comprised of noise in the channel, analog front-end circuit noise, and digital sigal processing non-idealities, such as quantization noise.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

Our approach is to attempt to ensure that process variation manifests itself as just another form of noise that remains within the noise margin of the device. Described herein are new circuit architectures, sometimes herein called Adaptive Precision Arithmetic (APA) units, in which slow circuits cause only small errors in the final output. In addition, APA designs may degrade gracefully with process variation in that slower circuits cause commensurately larger errors. Thus, these circuits continue to operate over a wider range of variation (albeit with larger errors injected) rather than suddenly failing to operate once the circuit speed is outside a given tolerance. In contrast, conventional arithmetic units fail the "cause small errors" criterion as they inject catastrophically large (MSB) errors when the worst case critical path delay, $T_{cp}$, is longer than the clock period, $T_s$, as described in T. C. Chen, "Where CMOS is going: trendy hype vs. real technology," ISSCC, 2006 IEEE Int. Conference Digest of Technical Papers, pp. 1-18, February 2006.

Table 1 is a list of notations used in the description.

TABLE 1

| Notation description | |
|---|---|
| Variable | Description |
| M | Number of taps in the filter |
| a | Tap coefficients of filter |
| X | Input into the filter |

TABLE 1-continued

Notation description

| Variable | Description |
| --- | --- |
| $B_a$ | Bit width of tap coefficients |
| $B_X$ | Bit width of filter input |
| $\beta$ | Delay reduction factor from rmv0 |
| $\alpha$ | Propensity to exercise critical path (expected delay reduction factor due to asynchronous design) |
| $T_{RT\text{-}limit}$ | Real time deadline for one filter computation |
| $T_s$ | Sample period of the system |
| $T_{FA}$ | One Full Adder delay |
| $T_{FAwc}$ | One Full Adder delay at worst-case process corner |
| $T_{cp}$ | Critical path delay of SA unit |
| $T_{cpwc}$ | Critical path delay of SA unit at worst-case process corner |
| $T_{FIR}$ | Total delay of one FIR computation |
| rmv0 | Removal of "0" Partial products |
| MSB1st | Computation from MSB to LSB |
| CT1st | Computation from center tap outward |

For some embodiments of the present invention, the APA architectures include of the combination of three ideas: 1) partial completion of the computation; as much computation is completed as possible within the real-time limit, $T_{RT\text{-}limit}$, all sub-computations that complete are considered correct, sub-computations that do not complete contribute noise to the output; 2) ordering the computation so that the most important computation is completed first (MSB-first design); and 3) asynchronous or adaptive synchronous circuits at the core of the design allowing each computation to take as much time as needed and no more (vs. traditional design where each computation is allocated the same worst-case delay).

According to embodiments of the present invention, the APA design strategy falls under the category of softDSP described in B. Shim, S. R. Sridhara, and N. R. Shanbhag, "Reliable Low-Power Digital Signal Processing via Reduced Precision Redundancy," IEEE Trans. VLSI, vol. 12, pp. 497-510, May 2004, where small errors are allowed in the final result. Closest to this approach, is the softDSP method of Reduced Precision Redundancy (RPR) described in B. Shim, S. R. Sridhara, and N. R. Shanbhag, "Reliable Low-Power Digital Signal Processing via Reduced Precision Redundancy," IEEE Trans. VLSI, vol. 12, pp. 497-510, May 2004. The RPR technique relies on the observation is that when conventional arithmetic units have errors due to process variation or noise, the errors generally occur in the MSBs and hence the error is large R. Hegde and N. R. Shanbhag, "Soft digital sigal processing," IEEE Trans. VLSI, vol. 9, pp. 813-823, December 2001. This feature is exploited in the RPR design, because large errors are easily detectable, (i.e. by exceeding the threshold $T_h$). The specific RPR implementation consists of an arithmetic unit computing a function $y_a[n]$ is coupled with a reduced-precision version of itself computing the function $y_r[n]$, When the system detects an error in $y_a[n]$, the replica copy is used in its place. The result is a combined function, $\hat{y}[n]$, defined in Equation. 4 of B. Shim, S. R. Sridhara, and N. R. Shanbhag, "Reliable Low-Power Digital Signal Processing via Reduced Precision Redundancy," IEEE Trans. VLSI, vol. 12, pp. 497-510. May 2004, as:

$$\hat{y}[n] = \begin{cases} y_a[n], & \text{if } |y_a[n] - y_r[n]| \leq T_h \\ y_r[n], & \text{if } |y_n[n] - y_r[n]| > T_h \end{cases} \quad (1)$$

where $T_h$ is a decision threshold determined by the system designers

The APA approach is different because the computations are re-ordered so that the most important computations are completed first, thus any errors produced are small and no correction or replica circuit is necessary. Rather than a fixed choice between two precisions (as in B. Shim, S. R. Sridhara, and N. R. Shanbhag, "Reliable Low-Power Digital Signal Processing via Reduced Precision Redundancy," IEEE Trans. VLSI, vol. 12, pp. 497-510, May 2004), the highest precision computation possible given the underlying speed of the circuit is produced. In embodiments of the present invention, the APA's result is different because the scalability is inherent to the proposed architecture and no replica copies are required to achieve this result. Therefore, much more performance scalability can be achieved than those in B. Shim, S. R. Sridhara, and N. R. Shanbhag, "Reliable Low-Power Digital Signal Processing via Reduced Precision Redundancy," IEEE Trans. VLSI, vol. 12, pp 497-510, May 2004.

Embodiments of the present invention include a multiply-accumulate (MAC) unit having a serial accumulator (SA). A list of partial products is generated by the multiplier operand, usually a filter tap or other coefficient. The partial products include shifted copies of the multiplicand when the multiplier bit is '1', and all zeros when the multiplier bit is '0'. After all partial products have been accumulated in the serial accumulator the output of the serial accumulator holds the multiplication result.

Note that in a serial accumulator, when multiplying a smaller bit-width number with a larger bit-width one, the smaller number should be used as the multiplier because fewer partial products are generated and the total delay of the multiplication is reduced.

To account for multiplication of negative numbers in the 2's complement signed number format, the design negates the input or multiplicand, X, when the tap or multiplier, a, is negative. That is, for a<0, X*(a) is converted into −X*|a|. Negation in two's complement is achieved by inverting all the bits and adding 1 or −X*|a|=($\overline{X}$+1)*|a|=$\overline{X}$*|a|+|a|, where $\overline{X}$ is X with all the bits inverted. Thus for negative taps, the input bits are inverted and the absolute value of the tap is added into the partial product list.

Figure 1A:
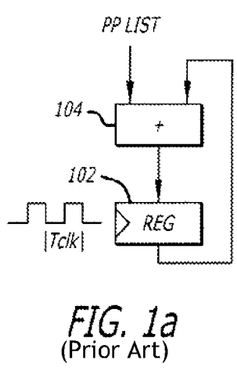
FIG. 1(a) shows a traditional synchronous adder design in which a register is clocked using a fixed frequency clock signal.

Adaptive synchronous serial accumulator and asynchronous serial accumulator architectures are described herein according to embodiments of the present invention and are contrasted with a traditional serial accumulator where a fixed clock frequency is set based on the critical path delay in the worst-case process corner. FIG. 1(a) shows a traditional synchronous adder design in which a register 102 is clocked using a fixed frequency clock signal. In this case, each adder 104 is allowed one or several clock cycles, but in which the amount of time allocated is fixed. Each computation is then launched on that next interval, which would be once in a clock period or once every N clock periods depending on how long the worst case computation takes.

Figure 1B:
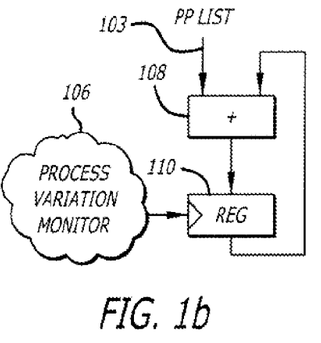
FIG. 1(b) shows adaptive synchronous adder architecture according to embodiments of the present invention.

FIG. 1(b) shows adaptive synchronous adder architecture according to embodiments of the present invention. For some embodiments, the idea of a clock is relaxed. The adaptive synchronous architecture in FIG. 1(b) is based on a variable clock frequency which is controlled by a process variation monitor circuit 106. The process variation monitor circuit 106 measures the critical path delay of the serial accumulator 108. For some embodiments, the process variation monitor circuit 106 may be implemented using a delay measurement circuit as described in R. Datta, J. A. Abraham, A. U. Diril, A. Chatterjee and K. Nowka, "Adaptive Design for Performance-Optimized Robustness," IEEE International Symposium On Defect and Fault Tolerance in VLSI Systems, 9 pp, October 2006, and may adjust the clock period accordingly. There may be a clock generation circuit shown in FIG. 10 below that sets the clock period to be just long enough to allow the worst-case computation under present process variation conditions to complete. The output of the clock generation circuit is input to the clock a register 110 at a variable rate.

Figure 1C:
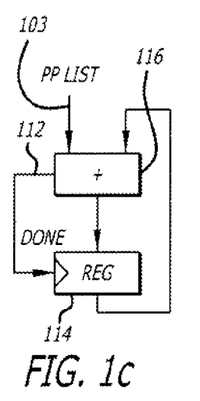
FIG. 1(c) shows asynchronous adder architecture according to embodiments of the present invention.

FIG. 1(c) shows an asynchronous adder architecture according to embodiments of the present invention. For this embodiments the idea of a clock is relaxed as well. In the asynchronous design, computations signal their completion by raising a DONE flag. This DONE signal 112 may be coupled to the clock input of the register 114 and the next data is launched once the previous computation in the serial accumulator 116 completes.

Regardless of the serial accumulator architecture implemented, the addition of the partial products 103 requires an intensive amount of computation that limits the performance of the system in which they are implemented. Each serial accumulator architecture implemented according to embodiments of the present invention accumulates as many of the partial products 103 as possible before $T_{RT-limit}$.

The performance of traditional serial accumulator designs is limited by the critical path delay, $T_{cp}$, of the adder in the serial accumulator. If the process corner exceeds the worst-case specified, the traditional serial accumulator design fails catastrophically, which has been noted in R. Hegde and N. R. Shanbhag, "Soft digital signal processing," IEEE Trans. VLSI, vol. 9, pp. 813-823, December 2001. Under the worst case process corner, the traditional serial accumulator and the adaptive synchronous serial accumulator have the same clock frequency and achieve the same result. The asynchronous serial accumulator also achieves the same result if all computations exercise the critical path although, as will be described below, this may be very unlikely. The adaptive synchronous and asynchronous serial accumulators continue to operate but with partial completion of all partial products. An improved ordering of the partial product list 103 that ensures the partial products that do not get completed contribute only small amounts of noise to the overall result is described below with reference to FIG. 7(a) and FIG. 7(b) Later it is shown to what extent these architectures, and the proposed ordering, can allow the serial accumulator to operate outside the worst-case process corner on a finite impulse response (FIR) filter example.

It is noted that under a nominal or fast process corner, the proposed serial accumulator architectures can process more partial products than the traditional serial accumulator, leading to a higher-precision result and less noise in the output. The adaptive synchronous serial accumulator processes more partial products by adjusting its clock frequency to be faster; the asynchronous serial accumulator processes more by finishing each addition faster and clocking in the partial products at a faster rate.

Ordering Computations

For embodiments of the present invention. APA serial accumulator architectures accumulate as many partial products as possible before some real time deadline for one multiply operation. The multiply operation may be embedded inside a larger computation that requires the summation of many multiply operation such as a filter computation an FFT butterfly computation, or other. $T_{RT-limit}$ defines the real time limit for the overall computation (single multiply whole FIR filter computation, whole FFT butterfly computation, or other). Therefore, the ordering of the partial products is significant, in that the partial products at the front of the partial products list 103 are more likely to be completed. Thus, to ensure the least amount of noise in the final output, the most important partial products are added in the APA serial accumulator architectures first. This is done by removing the zero partial products and then ordering the remaining partial products by MSB-first (MSB1st). In the case of the multiplier being embedded in a larger operation, the partial products for all the multiplies can be additionally re-ordered in a globally-optimal fashion as we will demonstrate later with the FIR filter computation.

Removing the "0" Partial Products

Recall that in partial product generation, the partial product is all zeros when the multiplier bit is '0'. Having zeros in the partial product list 103 contributes to the number of adder 108/116 computations and thus the total delay but has no affect on the value of the output of the system, y[n]. Therefore, these zero partial products are removed from the partial products list.

Removal of the zero partial products may be done on-the-fly as the partial products are being generated. If any multiplier bit is '0', that partial product is not added to the list. This method is referred to as 'rmv0'. When implementing a filter with fixed coefficients, one may use a shift-and-add for only the bit positions with '1's in the multiplier resulting in improved performance, area, and power consumption. However, a fully-programmable filter must populate the entire partial product array because it is unknown ahead of time which partial products will be needed. The rmv0 method has the advantages of the ASIC/fixed-coefficient filter by removing the zeros while also retaining full programmability.

Figure 11:
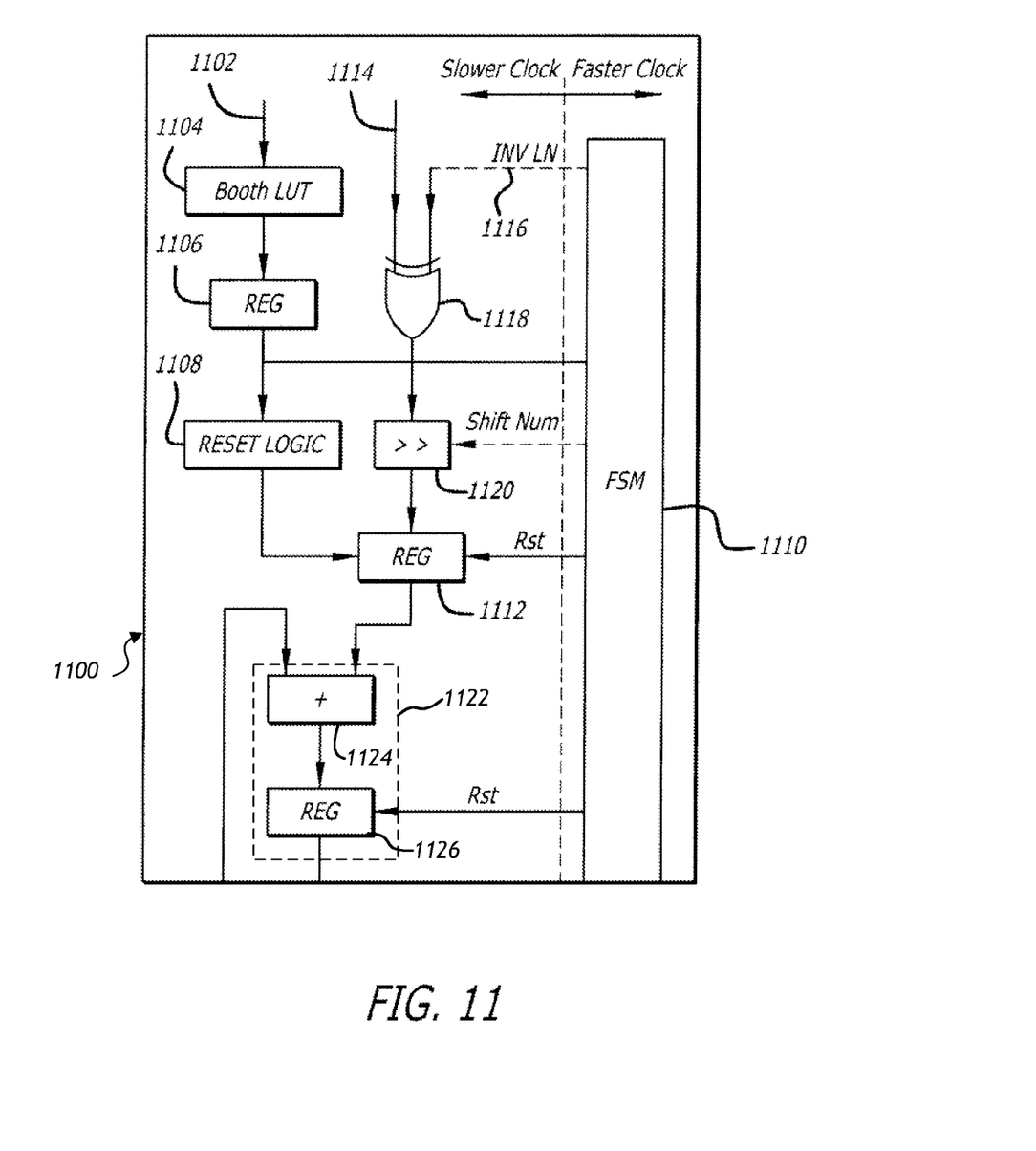
FIG. 11 illustrates circuitry suitable for ordering the computations on an MSB-first basis and for removing the zero partial products from the partial products list according to an embodiment of the present invention.

FIG. 11 illustrates circuitry suitable for ordering the computations on an MSB-first basis and for removing the zero partial products from the partial products list according to an embodiment of the present invention. FIG. 1 shows a modified Booth multiplier 1100 having a multiplier value 1102 input to an optional Booth lookup table (LUT) 1104. The Booth LUT 1104 is coupled to a register 1106, which is coupled to reset logic 1108 and a finite state machine (FSM) 1110. The reset logic 1108 is coupled to a register 1112. A multiplicand value 1114 and an INV EN signal 1116 are input to an NOR late 1118. The INV_EN sigal is asserted (−'1') when the multiplicand value 1114 is negative. An output of the NOR gate 1118 is coupled to a shifter 1120, which also receives an input from the FSM 1110. An output of the shifter 1120 is coupled to the register 1112, which has an output coupled to a serial accumulator 1122 having an adder 1124 and a register 1126. The FSM 1110 first resets registers 1112 and 1126 using the absolute value of the multiplier value. Next the FSM 1110, examines the output of register 1106 and begins with the MSB bit [N] and proceeds through to bit [1] as follows:

```
for j= N to 1
    if register 1106 bit [j] does not equal 0
        assert Shift Num = j
        assert Rst = 0
        wait for next clock
end
```

In order for the FSM 1110 to provide control signals to the rest of the circuit at a suitable rate while performing the rmv0 function, it may be required for the FSM 1110 to run at a faster rate than the rest of the circuit. The slower clock and faster clock dividing line 1130 shows which elements are clocked from the slow clock and which are clocked with the faster clock.

The FSM 1110 provides reset signals Rst to the registers 1112 ad 1126 and a shift_num sigal to the shifter 1120. For some embodiments the value of the reset signal is non-zero. Recall from above that for negative taps, the input bits are inverted, and the absolute value of the tap is added into the partial product list. This is the reset value output by the FSM 1110.

Figure 2:
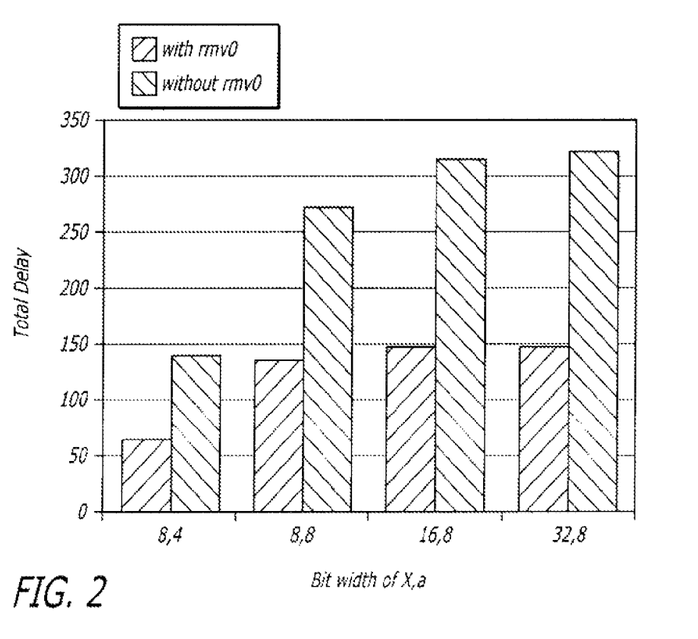
FIG. 2 shows simulation results of an eight tap filter with random taps and inputs for variable bit widths.

To understand the benefits of removal of the zero partial products, let β represent the ratio of the total delay before and after removal of the zero partial products, rmv0. Intuitively, β should be around 0.5 for random binary taps. Simulation results of an eight tap filter with random taps and inputs for variable bit widths are shown in FIG. 2. As illustrated in FIG. 2, the removal of the zero partial products rmv0 scheme achieves less than two times the total delay. Similarly, a β=0.2 was found for FIR filter taps with a root-raised cosine pulse shape and β=0.5 for the butterfly operation in a 64-point decimation-in-time FFT with 8-bit inputs and 12-bit coefficients MSB-First Computation During partial product generation, shifted copies of the multiplicand are added into the partial products list. Traditional synchronous designs compute the partial products generated from the LSB of the multiplier first (LSB1st). Such a scheme produces large errors in the final output of a serial accumulator if the real time deadline for one filter computation $T_{RT-limit}$ does not allow all partial products to complete. Alternatively, the MSB1st scheme proposed here computes the partial product generated from the MSB of the multiplier first and then continues to the second-most significant bit and so on.

FIR Tap Ordering

An M-tap FIR computation is defined by $$y[n] = \sum_{i=0}^{M} a_i X_{n-i} \quad (2)$$

where α are the tap coefficients and X are the input data. Let the tap coefficients and the input data be $B_a$ and $B_x$ bits wide, respectively. Each multiplier would then generate $B_a$ partial products, each of which is $N=B_a+B_x-1$ bits wide. As shown in (2), the FIR computation involves M multiply-accumulate operations. While it is important to order each multiply-accumulate computation with MSB1st, it is also important to consider the ordering of the multiply-accumulate operations into the final FIR result.

Figure 3A:
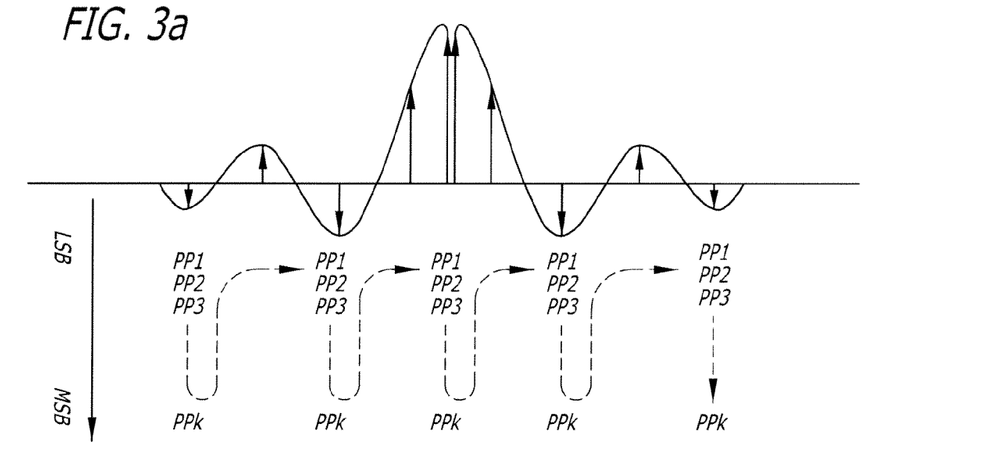
FIG. 3(a) shows a traditional ordering scheme for an FIR filter in which the computation is from left to right with LSB1 st.

FIG. 3(a) shows the traditional ordering scheme in which the computation is from left to right with LSB1st. The following algorithm also illustrates the traditional scheme.

```
for i=0:M-1,
  for j=1:Ba,
    sum = sum + pp(i*M + j);
  end
end
```

Figure 3B:
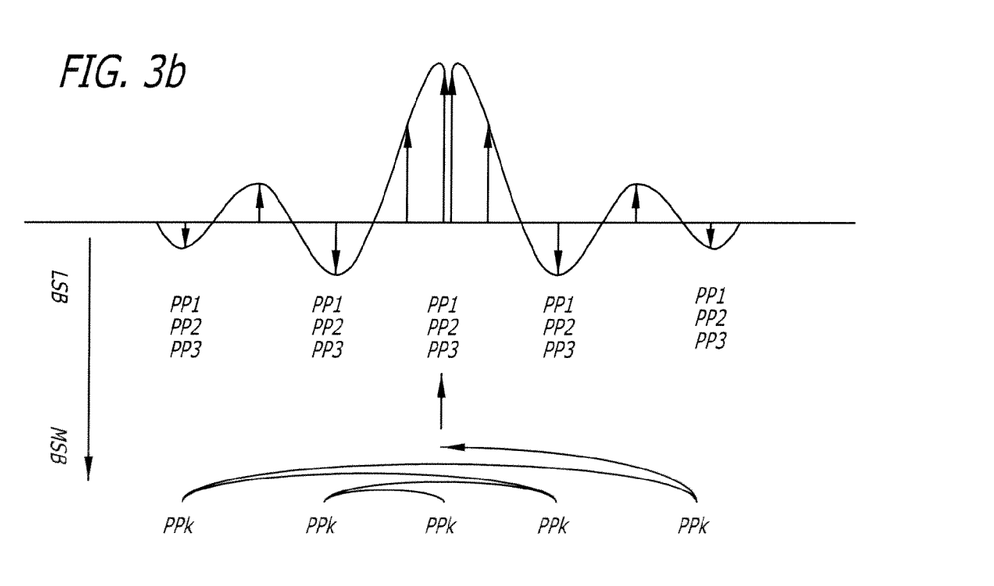
FIG. 3(b) shows a scheme for an FIR filter that computes the center taps first working outward with MSB1st according to embodiments of the present invention.

It is observed that the center tap in most FIR filters has higher magnitude than the rest, and thus contributes more to the final output resolution. The scheme according to embodiments of the present invention computes the center taps first working outward with MSB1st as shown in FIG. 3(b). Such a scheme enables a graceful degradation since the most important computations are completed first. The algorithm for this scheme, which is called center-tap-first (CT1st) with rmv0 is described below.

```
for i=Ba:-1:1,
  for j=center tap working outwards,
    if(a(i,j)~=0)
      sum = sum + pp((j-1)*Ba + i);
    end
  end
```

Serial Accumulator Delay Model

For an 8-bit carry ripple adder, R. Hegde and N. R. Shanbhag, "Soft digital signal processing," IEEE Trans. VLSI, vol. 9, pp. 813-823, December 2001 showed that 95% of all input combinations completed within five full adder delays. A similar delay model is used as R. Hegde and N. R. Shanbhag, "Soft digital signal processing," IEEE Trans. VLSI, vol. 9, pp. 813-823, December 2001, but is expanded to a variable length carry-propagate adder with random inputs. The $i^{th}$ bit propagate signal of the two operands, say A and B, of the adder is defined as $$P_i = A_i \oplus B_i. \quad (3)$$

When the propagate signal is high the carry out of that bit is directly influenced by the carry in. Given that the delay of a full-adder is $T_{FA}$, the path delay, $T_p$, of the adder is expressed as $T_p = Run_{max} T_{FA}$ where $Run_{max}$ is the maximal run of ones in the propagate signal, $P_i$, $T_{cp}$ is exercised when all bits of the propagate signal is high, therefore, each computation of an N-bit traditional adder would require $T_{cp} = NT_{FA}$ time units. For computations, such as an FIR filter or FFT, which are composed of multiple multiply-accumulate operations, the total delay, $T_{FIR}$ (for an FIR filter), is defined as $$T_{FIR} = \sum_{PP} T_c$$

where $T_c$ is the time for each partial product to complete and PP is the set of all partial products. In the following, $T_{FAwc}$ and $T_{cpwc}$ are defined respectively as $T_{FA}$ and $T_{cp}$ under the worst-ease process corner.

For a traditional serial accumulator designed for worst-case performance, each computation is launched at a fixed sample period, $T_s$, defined such that $T_{cpwc} \leq T_s$ in] R. Hegde and N. R. Shanbhag, "Soft digital signal processing," IEEE Trans. VLSI, vol. 9, pp. 813-823, December 2001. Outside the worst-case process corner where $T_{FA} > T_{FAwc}$, $T_{cp} > T_s$. In order to accumulate all the partial products within $T_{RT-limit}$, each accumulate computation is allotted only $N_w T_{FA}$ time units, where $N_w \equiv NT_{FAwc}/T_{FA} < N$. For computations when $Run_{max} > N_w$, the addition will not complete and some of the bits will be incorrect.

Outside worst-case process corner, an adaptive synchronous serial accumulator allows each computation enough time to finish by adjusting $T_s$ using a process monitor, for example process monitor 106, such that $T_{cp} \leq T_s$. The time for each partial product to complete is thus $T_c = T_s$. To ensure that $T_{FIR} < T_{RT-limit}$, only as many computations are completed as possible. The computations that are not completed contribute to the noise of the system. Thus an adaptive synchronous serial accumulator guarantees no errors in the completed partial product accumulation but leaves some partial products undone.

Figure 4:
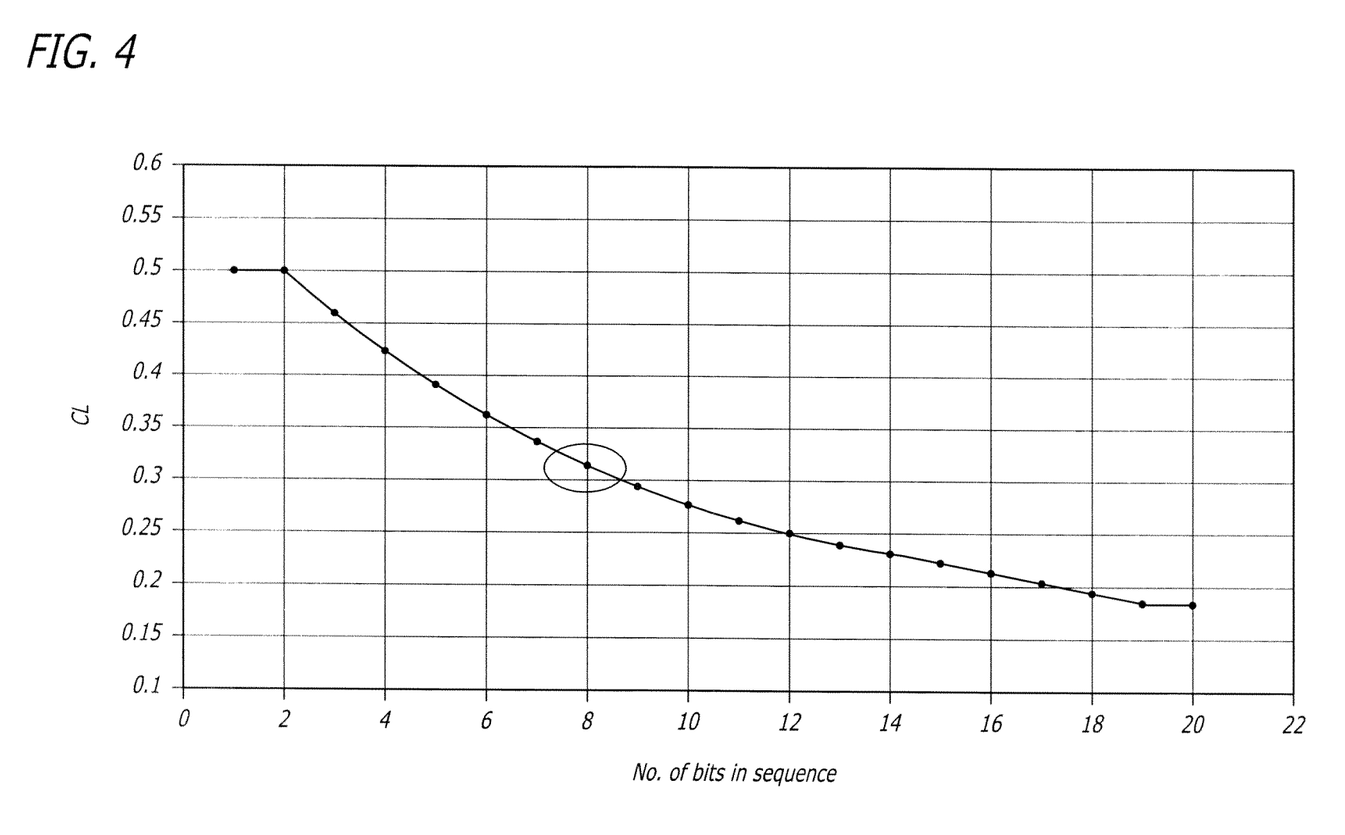
FIG. 4 illustrates propensity for random sequences to exercise the critical path for an asynchronous serial accumulator according to an embodiment of the present invention.

The asynchronous SA signals its completion and then clocks in the next partial product. Therefore, the delay of the asynchronous SA is just $T_c=T_p$. This architecture will execute faster than worst case if most partial products do not exercise the critical path. Here, an analysis of the propensity of random partial products to exercise the critical path is presented. The propagate signal of random operands can also be viewed as random. FIG. 4 shows the critical path propensity, $\alpha$, from an exhaustive simulation of n-bit random sequences where $$\alpha = \frac{E[T_p]}{T_{cp}} \quad (4)$$

where the expectation is taken across all $2^n$ binary numbers where n is the number of bits in the sequence. For an FIR filter, $T_{cp}$ is proportional to the final bit width of y[n], and is given by $$T_{cp} = [B_a + B_x - 1 + \text{floor}(\log_2(M))]T_{FA}. \quad (5)$$

FIG. 4 illustrates propensity for random sequences to exercise the critical path for an asynchronous serial accumulator according to an embodiment of the present invention. As can be seen from FIG. 4, $\alpha$ is roughly 0.2 when the multiplier output bit widths ae between 16 and 20. Data from the 8-bit adder in as R. Hegde and N. R. Shanbhag, "Soft digital signal processing," IEEE Trans. VLSI, vol. 9, pp. 813-823, December 2001, indicate an $\alpha$ of roughly 0.3, which is consistent with results in FIG. 4. Similarly, an $\alpha=0.27$ was found for FIR filter taps with a root raised cosine pulse shape and $\alpha=0.23$ for the butterfly operation of the 64-point DIT FFT. Therefore, the asynchronous serial accumulator is expected to perform about four times faster than the adaptive synchronous serial accumulator on typical data sets.

Simulation Results

Figure 5:
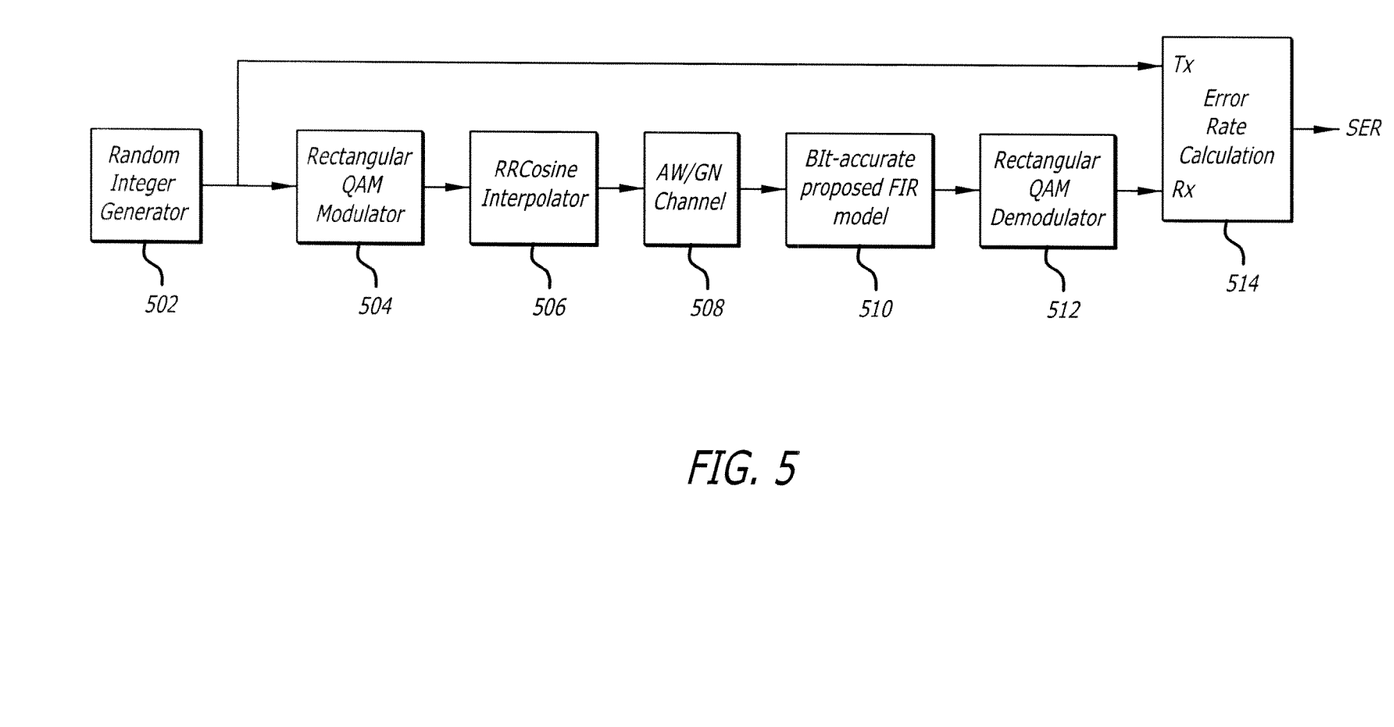
FIG. 5 is a simulation setup of an additive white Gaussian noise (AWGN) channel with 4, 16, 64 quadrature amplitude modulator (QAM) modulation according to an embodiment of the present invention.

FIG. 5 is a Matlab Simulink simulation setup of an additive white Gaussian noise (AWGN) channel with 4, 16, 64 quadrature amplitude modulator (QAM) modulation according to an embodiment of the present invention. In the setup, a random integer generator 502 is coupled to a rectangular QAM modulator 504. The rectangular QAM modulator 504 is coupled to a root-raised cosine (RRCosine) interpolator 506, which is coupled to an AWGN channel 508. The AWGN channel 508 is coupled to a bit-accurate FIR model 510 implemented according to embodiments of the present invention. The FIR model 510 is coupled to a rectangular QAM demodulator 512, which is coupled to one input of an error rate calculation 514. Another input of the error rate calculation 514 is received from an output of the random integer generator 502.

Using the setup in FIG. 5 to verify the performance of the APA architectures in a system context, the end-to-end communication system modeled in Matlab Simulink applied began with a uniform random bit stream from the random integer generator 502, which is modulated to 4, 16, or 64 QAM symbols in the rectangular QAM modulator 504, pulse shaped with the root-raised cosine (RRC) transmit filter 506, transmitted through the AWGN channel 508, matched filtered using the RRC receive filter (FIR model 510) and then demodulated in the rectangular QAM demodulator 512. The RRC filters 506 and 510 have an excess bandwidth factor of 0.3, an over sampling rate of 4 and 65 taps. Replacing the receive filter is the bit-accurate FIR model 510 implemented according to embodiments of the present invention. The FIR model 510 includes a selectable architecture design and tap order, bit order and total delay limit parameters. The filter input data and tap coefficients are quantized to $B_a=B_x=10$ bits. This setup shown in FIG. 5 illustrates shows how embodiments of the present invention may be used as a receive matched filter for a communication channel.

Figure 6:
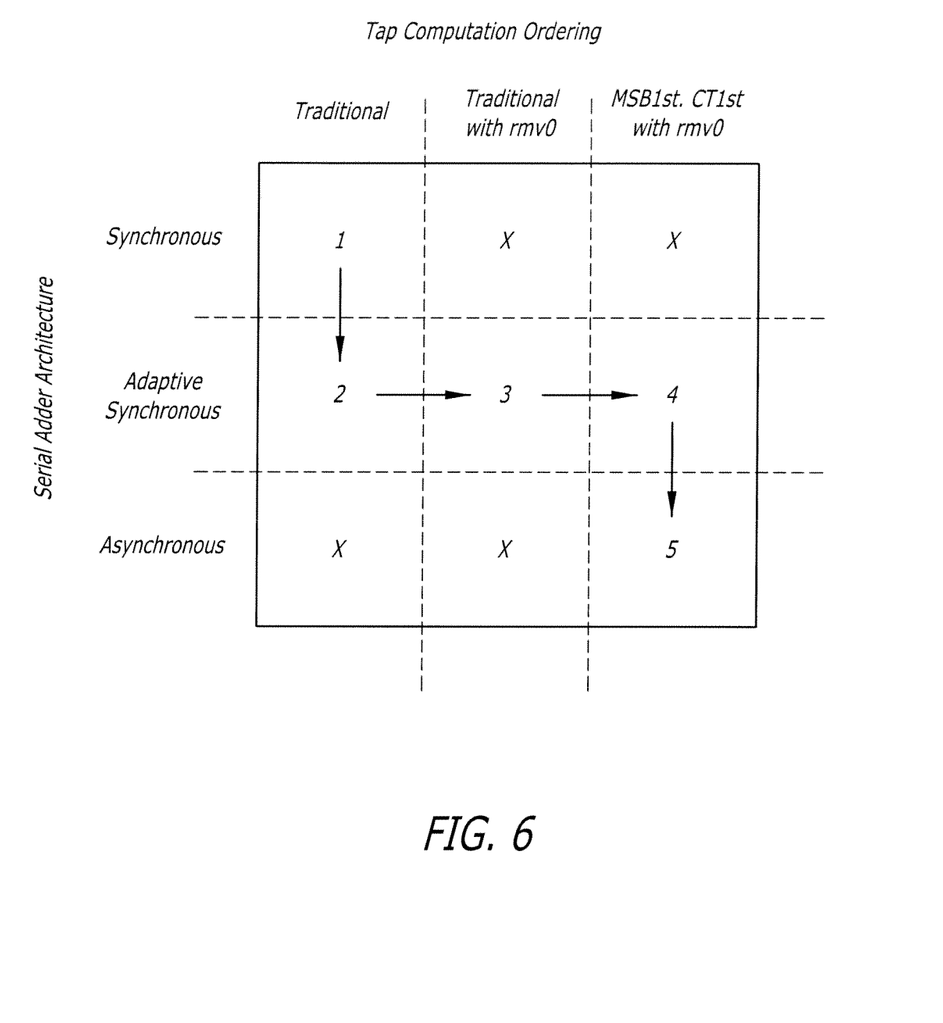
FIG. 6 shows a grid of possible combinations of designs according to an embodiment of the present invention.

Two architectural dimensions are analyzed. FIG. 6 shows a grid of possible combinations of designs according to an embodiment of the present invention. The first dimension is the serial accumulator architecture divided into 1) synchronous, 2) adaptive synchronous and 3) asynchronous. The second dimension is the ordering of the tap computations categorized as 1) traditional, 2) traditional with rmv0 and 3) MSB1st and CT1st with rmv0.

The RRC filter 510 according to a embodiment of the present invention used in the setup in FIG. 5 contains 65 10-bit taps, of which 26 are negative. Recall that the APA architecture deals with negative taps by inverting the input bits and adding |a| into the partial product list. Thus, there are 65*10+26=676 partial products. Removing the zero partial products reduces the list to 138 elements meaning the taps are not highly populated with ones ($\beta=0.2$). The final bit width of y[n] from Eqn. 5 is N=25. For a traditional synchronous serial accumulator without rmv0 under worst case corners, $T_{cpwc}=25T_{FAwc}$ and $T_{FIR}675*T_{cpwc}=16875T_{FAwc}$. Accordingly with rmv0, $T_{FIR}=137*T_{cpwc}=3425T_{FAwc}$. Note that the design assumes the first partial product computation does not incur delay. Thus for N partial products, there are only N−1 accumulate computations. This would be the total delay of the adaptive synchronous serial accumulator under the worst-case process corner. It would also be the total delay of the asynchronous serial accumulator under the worst-case process corner if all partial products exercised the critical path.

Figure 7A:
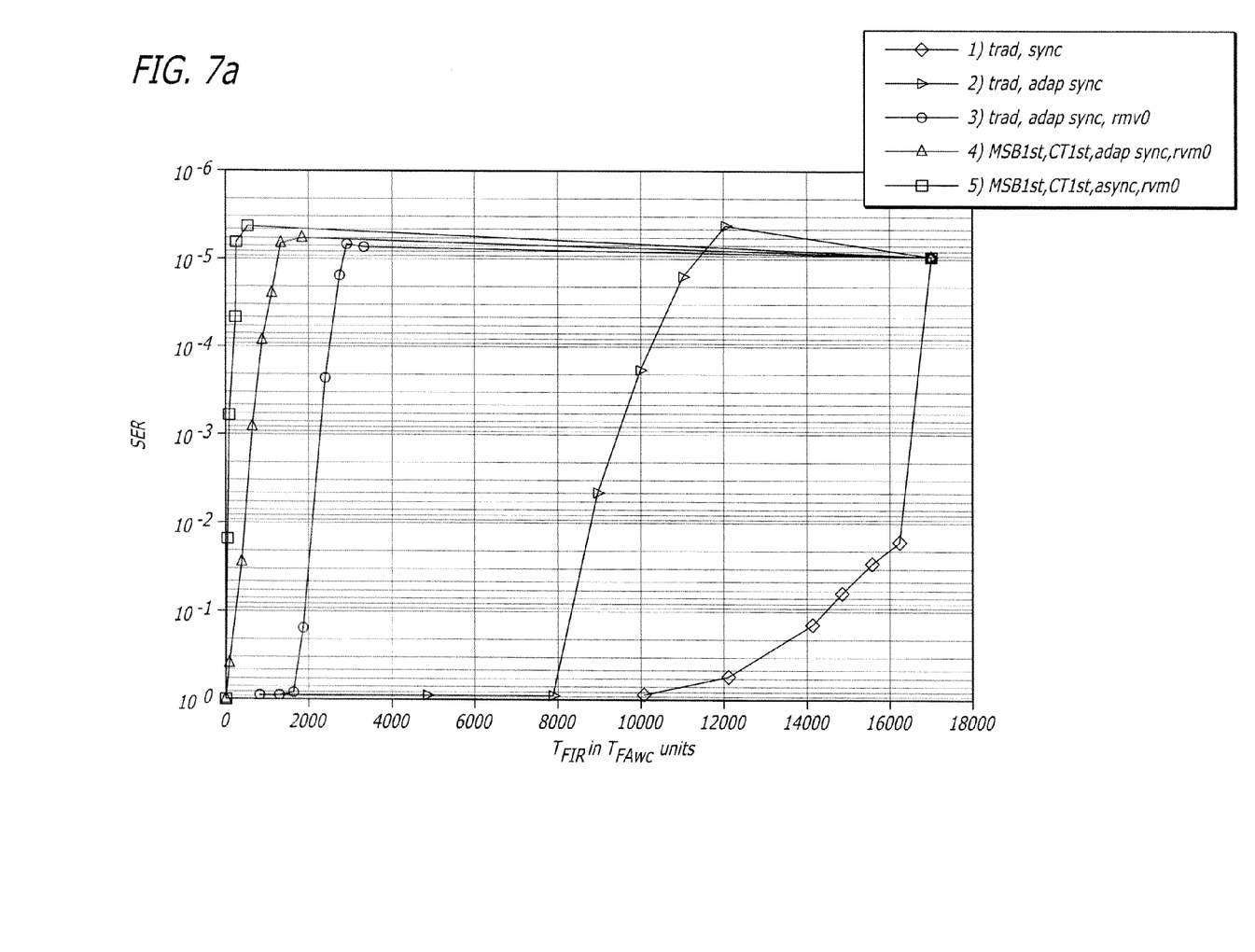
FIG. 7(a) illustrates the symbol error rate (SER) versus $T_{FIR}$ for the five different design methodologies shown and numbered in FIG. 6 according to an embodiment of the present invention.
Figure 7B:
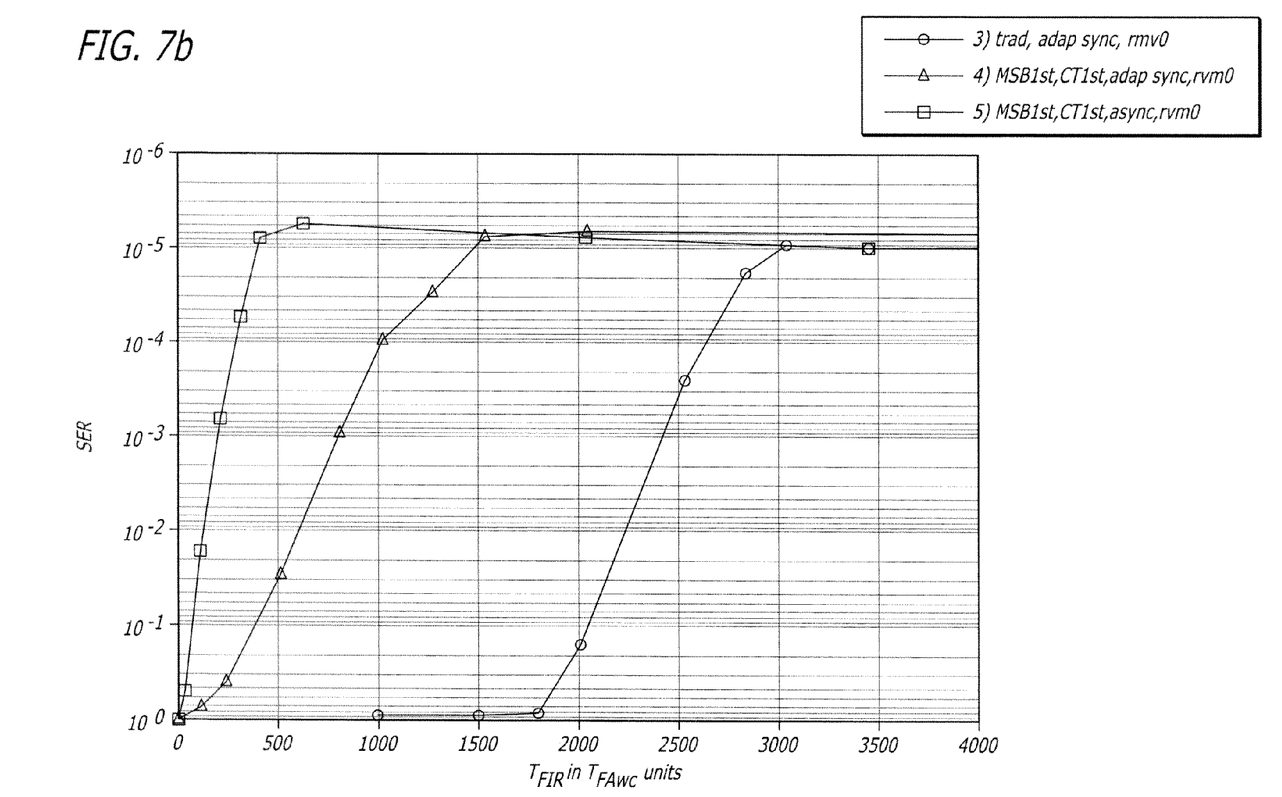
FIG. 7(b) illustrates the zoom in of FIG. 7(a) according to an embodiment of the present invention.

FIG. 7(a) illustrates the symbol error rate (SER) versus $T_{FIR}$ for the five different design methodologies shown and numbered in FIG. 6. That is (a) SER vs. $T_{FIR}$ of architectures numbered in FIG. 6. FIG. 7(b) illustrates the zoom in of 7(a). The results are based on a 64 QAM modulator with 26.5 dB symbol SNR. The zoomed in plot of schemes (3), (4) and (5) is shown in FIG. 7(b). With only a 4% delay penalty or equivalently $N_w=24$, the traditional synchronous serial accumulator induces catastrophic error dropping to less than $10^{-2}$ SER as expected and as similarly reported in R. Hegde and N. R. Shanbhag, "Soft digital signal processing," IEEE Trans. VLSI, vol. 9 pp. 813-823, December 2001. Table 2 summarizes the delay reduction factors from FIG. 7 due to each architecture. Thus, FIGS. 7(a) and 7(b) show that there is a small amount of error injected by architectures implemented according, to embodiments of the present invention.

TABLE 2

Total delay reduction factor across schemes

| Scheme | Adder Architecture | Tap Comp. Ordering | Minimum Total Delay | Successive Delay Reduction | Overall Delay Reduction |
|---|---|---|---|---|---|
| 1 | sync | trad | 16875 | 1 | 1 |
| 2 | adap. sync | trad | 11500 | 1.47 | 1.5 |
| 3 | adap. sync | trad, rmv0 | 3000 | 3.83 | 5.6 |
| 4 | adap. sync | MSB1st, CT1st, rmv0 | 1500 | 2.00 | 11.3 |
| 5 | async | MSB1st, CT1st, rmv0 | 400 | 3.75 | 42.2 |

To achieve the target $10^{-5}$ SER, an adaptive synchronous SA with traditional ordering would require a minimum $T_{FIR}$ of approximately $11,500 T_{FAwc}$. Therefore, this design change alone yields a 1.5× delay improvement. This means that leaving some partial products undone and guaranteeing no errors in the completed ones is better than accumulating all the partial products with some of them having errors.

Integrating rmv0 into the design reduces $T_{FIR}$ to $300 T_{FAwc}$, and thus produces a further 3.8× improvement. Using the MSB1st and CT1st ordering scheme adds another 2× improvement ($T_{FIR}=150_{FAwc}$). So far an overall delay reduction factor of 11× is achieved for an adaptive synchronous, MSB1st, CT1st ad rmv0 architecture. Incorporating an asynchronous design achieves a further 3.7× improvement or $\alpha=0.27$ at a minimum $T_{FIR}$ of $400 T_{FAwc}$. Thus, an asynchronous architecture with modified tap ordering and rmv0 yields an overall 1.5*3.8*2*3.75=42× delay reduction factor.

Simulation results in B. Shim, S. R. Sridhara, and N. R. Shanbhag, "Reliable Low-Power Digital Signal Processing via Reduced Precision Redundancy," IEEE Trans. VLSI, vol. 12, pp. 497-510, May 2004 compared the performances of a traditional versus a RPR receive FIR filter for a 4 QAM system transmitted through an AWGN channel. Results indicated the RPR technique achieved the desired performance (BER=$10^{-7}$) up to a voltage overscaling factor, $K_{vos}$, of 0.6 while traditional design failed almost immediately at $K_{vos}=0.9$. The propagation delay model described in R. Hegde and N. R. Shanbhag, "Soft digital signal processing," IEEE Trans. VLSI, vol. 9, pp. 813-823, December 2001, can be used to relate $K_{vos}$ and $T_{FIR}$, $$\tau = \frac{C_L V_{dd}}{\beta(V_{dd} - V_t)^\alpha}. \tag{6}$$

B. Shim, S. R. Sridhara, and N. R. Shanbhag, "Reliable Low-Power Digital Signal Processing via Reduced Precision Redundancy," IEEE Trans. VLSI, vol. 12, pp. 497-510, May 2004, assumed a 0.25 um process ($V_t=0.47$) with $V_{dd}=2.5$ and $\alpha=1.2$. In order to meet $T_{RT-limit}$, an increase in $\tau$ can directly be modeled as a decrease in $T_{FIR}$. For instance, it can be calculated that at $K_{vos}=0.5$, $\tau$ is increased by a factor of 1.57 and thus $T_{FIR}$ is decreased by a factor of 1.57.

Figure 8:
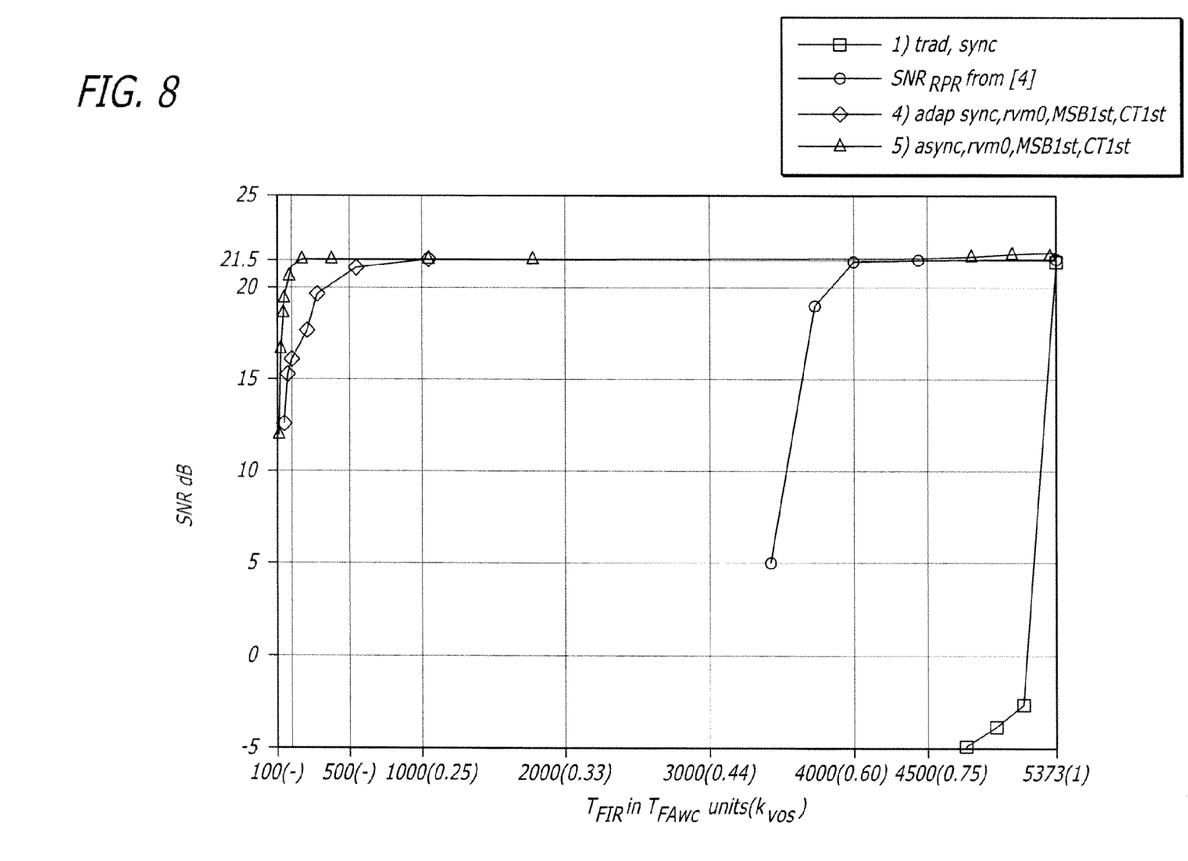
FIG. 8 illustrates a comparison of RPR, traditional synchronous, and serial accumulators implemented according to embodiments of the present invention.

FIG. 8 shows the performance of the adaptive synchronous serial accumulator and asynchronous serial accumulator on the filter used in B. Shim, S. R. Sridhara, and N. R. Shanbhag, "Reliable Low-Power Digital Signal Processing via Reduced Precision Redundancy," IEEE Trans. VLSI, vol. 12, pp. 497-510, May 2004, as well as the RPR results of B. Shim, S. R. Sridhara, and N. R. Shanbhag, "Reliable Low-Power Digital Signal Processing via Reduced Precision Redundancy," IEEE Trans. VLSI, vol. 12, pp. 497-510, May 2004, FIG. 13a, normalized in terms of $T_{FAwc}$ (with the equivalent $K_{vos}$ factor) using equation (6). The results of B. Shim. S. R. Sridhara, and N. R. Shanbhag, "Reliable Low-Power Digital Signal Processing via Reduced Precision Redundancy," IEEE Trans. VLSI, vol. 12, pp. 497-510, May 2004, FIG. 13a, are for the folded FIR architecture of B. Shim, S. R. Sridhara, and N. R. Shanbhag, "Reliable Low-Power Digital Signal Processing via Reduced Precision Redundancy" IEEE Trans. VLSI, vol. 12, pp. 497-510, May 2004, FIG. 8a. In order to compare these results to the unfolded (i.e. serial accumulator) architecture, they were further normalized to the unfolded FIR architecture shown in B. Shim, S. R. Sridhara, and N. R. Shanbhag, "Reliable Low-Power Digital Signal Processing via Reduced Precision Redundancy," IEEE Trans. VLSI, vol. 12, pp. 497-510, May 2004, FIG. 8b. In moving from the folded to the unfolded architecture, the path delay distribution will change slightly and affect the performance of the RPR filter. However, this effect has only a small impact on the final comparison. For $T_{FIR}<1000$, $K_{VOS}V_{DD}$ would be in the sub-threshold region, and thus equation (6) is no longer valid. The replicated filter has $\beta=0.33$ and $\alpha=0.19$. The plot in FIG. 8 also includes the performance of the traditional filter architecture generated using the model presented in the Serial Accumulator Delay Model section described above.

FIG. 8 also shows that the APA adaptive synchronous and asynchronous architectures perform 7.3× and 40× respectively better than the RPR technique. Compared with the traditional architecture, adaptive synchronous and asynchronous implemented according to embodiments of the present invention perform 10× and 53× respectively better.

The performance of the APA architectures exceeds the 25% delay variation reported in T. C. Chen, "Where CMOS is going: trendy hype vs. real technology," ISSCC, 2006 IEEE Int. Conference Digest of Technical Papers, pp. 1-18, February 2006, for the 90 nm node by a wide margin. Although process variation is expected to worsen at smaller feature lengths, it is not expected that they will exceed the more than 10× delay margins achieved by the APA architectures in the near future. Therefore, there is an opportunity to use the extra delay margin for some other purpose. The most obvious use, and the one outlined in R. Hegde and N. R. Shanbhag, "Soft digital signal processing," IEEE Trans. VLSI, vol. 9, pp. 813-823, December 2001, is voltage over scaling to save power consumption. To achieve the same delay as the traditional architecture, it is estimated using B. H. Calhoun, A. Wang and A. Chandrakasan, "Modeling and Sizing for Minimum Energy Operation in Subthreshold Circuits," IEEE Journal of Solid-State Circuits, vol. 40, no. 9, September 2005, Eqn. 2, the adaptive synchronous and asynchronous serial accumulators would achieve $K_{VOS}$ of 0.33 and 0.22 respectively (in the 0.18 um 18V $V_{DD}$ process for subthreshold operation presented in B. H. Calhoun, A. Wang and A. Chandrakasan, "Modeling and Sizing for Minimum Energy Operation in Subthreshold Circuits," IEEE Journal of Solid-State Circuits, vol. 40, no. 9, September 2005) for theoretical power savings of 88% and 95% respectively from B. Shim, S. R. Sridhara, and N. R. Shanbhag, "Reliable Low-Power Digital Signal Processing via Reduced Precision Redundancy," IEEE Trans. VLSI, vol. 12, pp. 497-510, May 2004, Eqn. 33. Of course, final power consumption numbers would have to include the overhead of the process monitoring in the adaptive synchronous serial accumulator architecture, and the asynchronous circuit overhead in the asynchronous serial accumulator architecture.

According to embodiments of the present invention, two multiply accumulate architectures for a FIR filter application that can achieve graceful degradation across process variation were presented. Contributions include 1) partial completion of the partial product accumulation rather than erroneous completion of all partial products, 2) ordering of the computation with rmv0. MSB1st, and CT1st schemes, and 3) asynchronous and adaptive synchronous SA design. It was shown that each of these individual ideas has significant effect on the robustness of the final result (from 1.5× to 3.8× individually) on the FIR filter example presented here. Taken together, the total delay can be reduced by 11× or 42× for an adaptive synchronous or asynchronous architecture respectively and still achieve the required quality of service. Initial calculations show that similar results are possible in the FFT domain as well ($\alpha=0.23$ and $\beta=0.5$ for a 64-pt decimation-in-time FFT).

Figure 9:
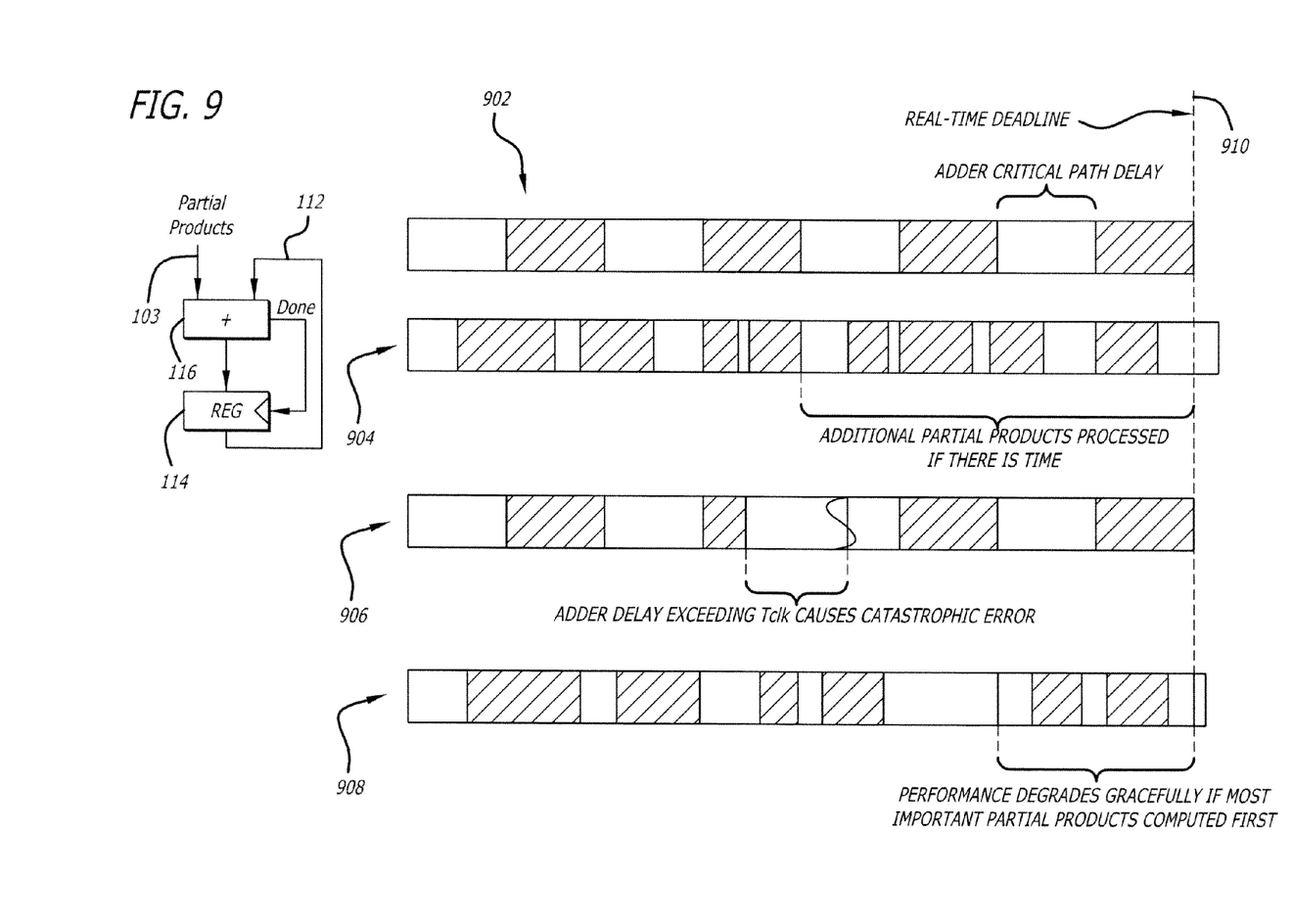
FIG. 9 illustrates an example multiply computation implementing an asynchronous serial accumulator according to an embodiment of the present invention.

FIG. 9 illustrates an example multiply operation implementing an asynchronous serial accumulator according to an embodiment of the present invention. In FIG. 9, a first graph 902 shows performance of a traditional synchronous serial accumulator. As can be seen, the adder critical path delay is fixed.

A second graph 904 shows performance of an asynchronous serial accumulator implemented according to embodiments of the present invention. It can be seen that in the asynchronous serial accumulator, the adder critical path delay is variable and there are additional partial products processed is there is time remaining until the real-time deadline for the FIR result has not elapsed. The dotted line 910 represents the real-time deadline for the FIR result.

A third graph 906 shows performance of traditional synchronous serial accumulator. As can be seen, the adder critical path delay is again fixed. If the unit has a slow process, the adder delay may exceed the clock period Tclk, causing catastrophic error. That is, the device may fail.

A fourth graph 908 shows performance of an asynchronous serial accumulator having a slow process implemented according to embodiments of the present invention. It can be seen that in the asynchronous serial accumulator although performance degrades due to the slow process it will degrade gracefully because additional partial products processed before time remaining until the real-time deadline for the FIR result has elapsed are computed first.

Figure 10:
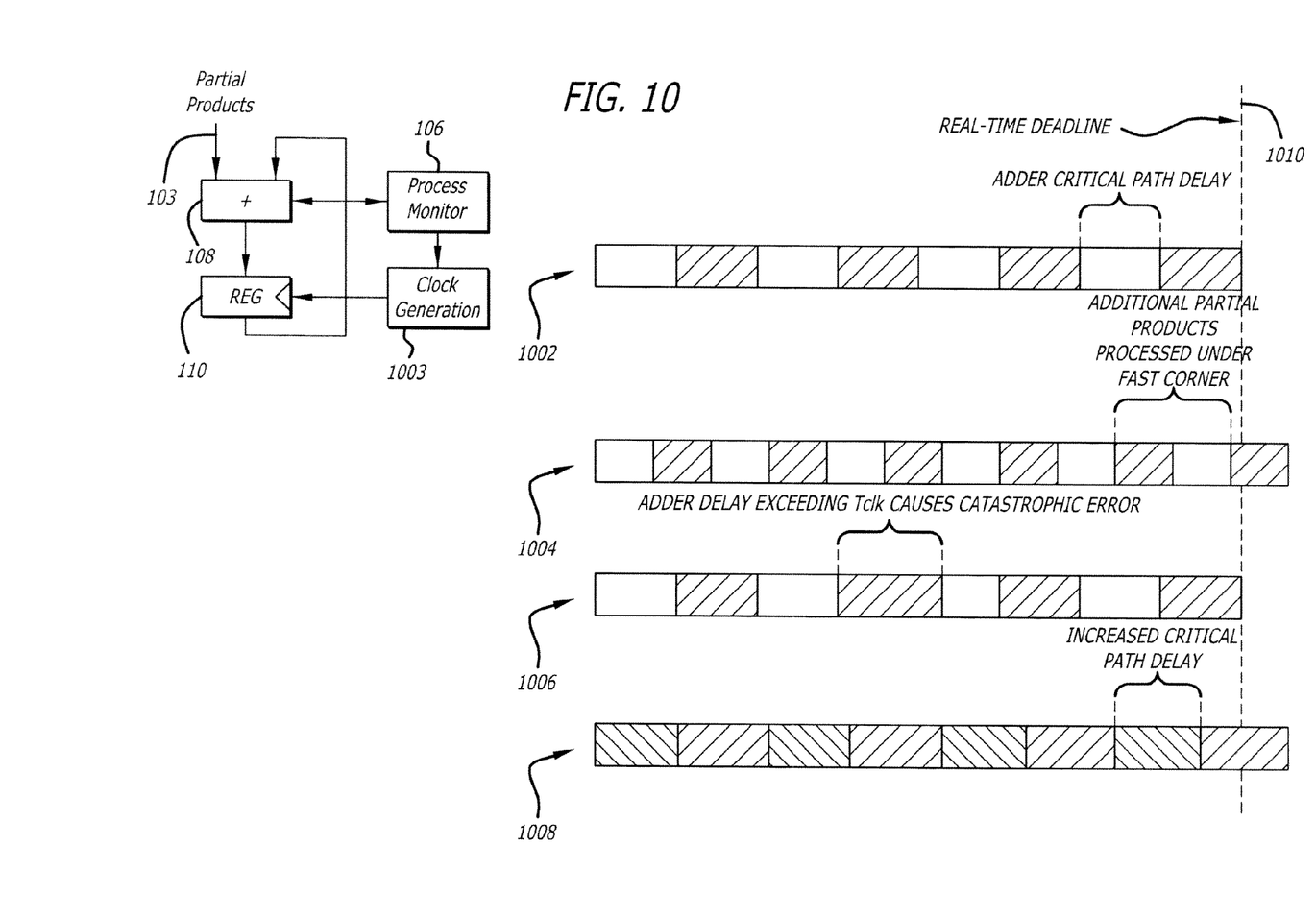
FIG. 10 illustrates an example multiply computation implementing an adaptive synchronous serial accumulator according to an embodiment of the present invention.

FIG. 10 illustrates an example multiply operation implementing an adaptive synchronous serial accumulator according to an embodiment of the present invention. The adaptive synchronous serial accumulator depicted in FIG. 10 includes the serial accumulator 108 receiving the partial products 103. The serial accumulator 10S output is coupled to the register 110. the process monitor 106 is coupled to the serial accumulator 108 and a clock generation circuit 1003, which may be a PLL. In FIG. 10, a first graph 1002 shows performance of a traditional adaptive synchronous serial accumulator. As can be seen, the adder critical path delay is fixed.

A second graph 1004 shows performance of an adaptive synchronous serial accumulator implemented according to embodiments of the present invention. It can be seen that in the adaptive synchronous serial accumulator, the adder critical path delay may be variable and there are additional partial products processed if there is time remaining until the real-time deadline for the FIR result has not elapsed. The dotted line 1010 represents the real-time deadline for the FIR result.

A third graph 1006 shows performance of traditional adaptive synchronous serial accumulator with a slow process. As can be seen, the adder critical path delay is again fixed, because the unit has a slow process, the adder delay may exceed the clock period Tclk, causing catastrophic error.

A fourth graph 1008 shows performance of an adaptive synchronous serial accumulator having a slow process implemented according to embodiments of the present invention. It can be seen that in the adaptive synchronous serial accumulator although performance degrades (additional adder critical path delay) due to the slow process it will degrade gracefully because the most important partial products are computed first.

Embodiments of the present invention may be implemented using hardware, software, or a combination thereof. In implementations using software, the software may be stored on a machine-accessible medium. A machine-accessible medium includes any mechanism that may be adapted to store and/or transmit information in a form accessible by a machine (e.g., a computer, network device, personal digital assistant, manufacturing tool, any device with a set of one or more processors, etc. For example, a machine-accessible medium includes recordable and non-recordable media (e.g., read only memory (ROM, random access memory (RAM, magnetic disk storage media, optical storage media, flash memory devices, etc. as recess as electrical, optical, acoustic, or other form of propagated signals (e.g., carrier waves, infrared signals, digital signals, etc.

In the above description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the invention to the specific embodiments disclosed in the specification and the claims. Rather, the scope of embodiments of the invention is to be determined entirely by the following claims which are to be construed in accordance with established doctrines of claim interpretation.

What is claimed is:

1. An apparatus comprising:
   multiplier-receiving circuitry to receive a multiplier;
   multiplicand-receiving circuitry to receive a multiplicand;
   list-generating circuitry coupled to the multiplier-receiving circuitry and the multiplicand-receiving circuitry to generate a list that includes only non-zero partial products of a binary multiplication of the multiplier and the multiplicand, wherein the list-generating circuitry generates partial products beginning with the most significant bit (MSB) of the multiplier;
   a serial adder coupled to the list-generating circuitry to add the non-zero partial products in the list; and
   circuitry to adjust the clock period of the serial adder to a different clock period.

2. An apparatus comprising:
   multiplier-receiving circuitry to receive a multiplier;
   multiplicand-receiving circuitry to receive a multiplicand;
   list-generating circuitry coupled to the multiplier-receiving circuitry and the multiplicand-receiving circuitry to generate a list that includes only non-zero partial products of a binary multiplication of the multiplier and the multiplicand, wherein the list-generating circuitry generates partial products beginning with the most significant bit (MSB) of the multiplier; and
   a serial adder coupled to the list-generating circuitry to add the non-zero partial products in the list, wherein the serial adder comprises an adaptive synchronous serial adder.

3. The apparatus of claim 2 wherein the adaptive synchronous serial adder comprises:
an adder;
a register;
a process monitor; and
a clock generator,
wherein the process monitor is to measure a critical path delay of the adder,
wherein the clock generator is to generate a clock signal having a period slightly longer than the critical path delay of the adder,
wherein the adder is to perform at least one computation on the non-zero partial products in the list,
wherein the register is to store the latest computation completed by the adder, and
wherein the clock signal is coupled to clock the latest computation into the accumulation register.

4. The apparatus of claim 3 wherein the clock generator comprises a phase-locked loop (PLL).

5. The apparatus of claim 1 wherein the list-generating circuitry comprises a Booth multiplier.

6. An apparatus comprising:
multiplier-receiving circuitry to receive a multiplier;
multiplicand-receiving circuitry to receive a multiplicand;
list-generating circuitry coupled to the multiplier-receiving circuitry and the multiplicand-receiving circuitry to generate a list that includes only non-zero partial products of a binary multiplication of the multiplier and the multiplicand, wherein the list-generating circuitry generates partial products beginning with the most significant bit (MSB) of the multiplier; and
a serial adder coupled to the list-generating circuitry to add the non-zero partial products in the list;
wherein the list-generating circuitry comprises:
a lookup table to receive the multiplier;
a first register coupled to an output of the lookup table;
reset logic, the first register having an output coupled to an input of the reset logic;
a finite state machine, the first register having an output coupled to an input of the finite state machine;
a second register having a first input coupled to an output of the reset logic and a second input coupled to a first output of the finite state machine;
an XOR gate having a first input coupled to receive the multiplicand and a second input coupled to a second output of the finite state machine;
a shifter having a first input coupled to an output of the XOR gate, a second input coupled to a third output of the finite state machine, and an output coupled to a third input of the second register; and
a serial accumulator having a first input coupled to an output of the second register and a second input coupled to the first output of the finite state machine.

7. The apparatus of claim 6
wherein the multiplier is a filter tap coefficient.

8. The apparatus of claim 1 wherein the list-generating circuitry generates partial products beginning with the most significant bit (MSB) of the multiplier and continuing in descending order of significance to the least significant bit (LSB) of the multiplier.

9. The apparatus of claim 1 wherein the list-generating circuitry generates partial products beginning with a center tap of a FIR filter.

10. A system comprising:
a finite impulse response (FIR) filter having:
multiplier-receiving circuitry to receive a multiplier,
multiplicand-receiving circuitry to receive a multiplicand,
list-generating circuitry to generate a list that includes only non-zero partial products of the binary multiplication of the multiplier and the multiplicand, wherein the list-generating circuitry generates partial products beginning with the most significant bit (MSB) of the multiplier, and
a serial adder coupled to the list-generating circuitry to add the non-zero partial products in the list;
circuitry coupled to an input of the FIR filter; and
circuitry coupled to an output of the FIR filter, the circuitry comprising:
a random integer generator,
a rectangular quadrature amplitude modulator (QAM) coupled to the random integer generator,
a cosine interpolator coupled to the rectangular QAM, and
an AW/GN channel coupled to the cosine interpolator.

11. The system of claim 10 wherein the FIR filter comprises an eight tap FIR filter.

12. The system of claim 10 wherein the list-generating circuitry generates partial products beginning with the most significant bit (MSB) of the multiplier and continuing in descending order of significance to the least significant bit (LSB) of the multiplier.

13. The system of claim 10 wherein the list-generating circuitry generates partial products beginning with a center tap of a FIR filter.

14. A system comprising:
a finite impulse response (FIR) filter having:
multiplier-receiving circuitry to receive a multiplier,
multiplicand-receiving circuitry to receive a multiplicand,
list-generating circuitry to generate a list that includes only non-zero partial products of the binary multiplication of the multiplier and the multiplicand, wherein the list-generating circuitry generates partial products beginning with the most significant bit (MSB) of the multiplier, and
a serial adder coupled to the list-generating circuitry to add the non-zero partial products in the list;
circuitry coupled to an input of the FIR filter; and
circuitry coupled to an output of the FIR filter, the circuitry coupled to the output of the FIR filter comprising:
a rectangular quadrature amplitude modulator (QAM) coupled to a random integer generator; and
an error rate calculation circuit coupled to the rectangular QAM.

* * * * *